(12) United States Patent
Shiraiwa et al.

(10) Patent No.: US 7,196,008 B1
(45) Date of Patent: Mar. 27, 2007

(54) ALUMINUM OXIDE AS LINER OR COVER LAYER TO SPACERS IN MEMORY DEVICE

(75) Inventors: Hidehiko Shiraiwa, San Jose, CA (US); Satoshi Torii, Sunnyvale, CA (US); Jaeyong Park, Sunnyvale, CA (US); Joong Jeon, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/087,793

(22) Filed: Mar. 23, 2005

(51) Int. Cl.
*H01L 21/44* (2006.01)

(52) U.S. Cl. .................. 438/688; 438/261; 257/E21.18; 257/E21.28; 257/E29.209; 257/E21.21; 257/E21.423; 257/E21.679

(58) Field of Classification Search ................. 438/596, 438/688, 595, 261, FOR. 405; 257/E21.18, 257/E21.28, E29.309, E21.21, E21.423, E21.679
See application file for complete search history.

(56) References Cited

U.S. PATENT DOCUMENTS

| | | | | |
|---|---|---|---|---|
| 4,944,682 A | * | 7/1990 | Cronin et al. | 438/586 |
| 5,707,901 A | * | 1/1998 | Cho et al. | 438/595 |
| 5,731,242 A | * | 3/1998 | Parat et al. | 438/586 |
| 5,946,589 A | * | 8/1999 | Ng et al. | 438/586 |
| 2003/0015752 A1 | * | 1/2003 | Palm et al. | 257/315 |
| 2005/0153511 A1 | * | 7/2005 | Jung | 438/257 |
| 2006/0192243 A1 | * | 8/2006 | Bhattacharyya | 257/315 |

* cited by examiner

*Primary Examiner*—Michelle Estrada
(74) *Attorney, Agent, or Firm*—Monica H. Choi

(57) ABSTRACT

For fabricating a memory device, spacers are formed to sides of word-line gates. In addition, aluminum oxide is formed as one of a liner layer or a cover layer to the spacers. The aluminum oxide has a chemical composition of $Al_2O_3$ for example. Such aluminum oxide may be used as an etch stop layer in a periphery region, a metal silicide block, and a hydrogen block for enhanced performance of the memory device.

20 Claims, 8 Drawing Sheets

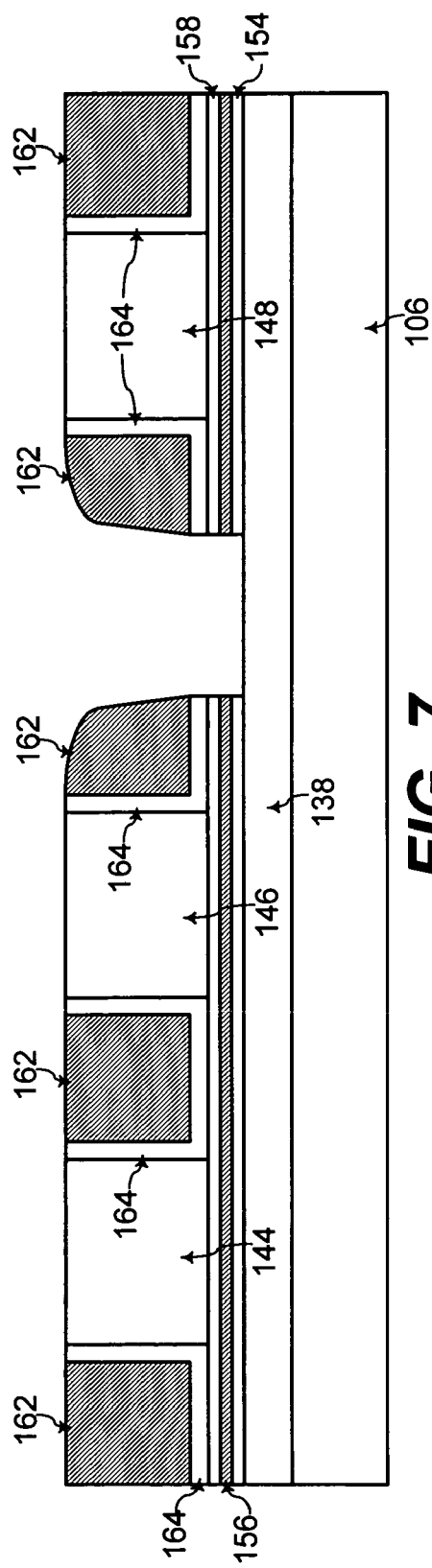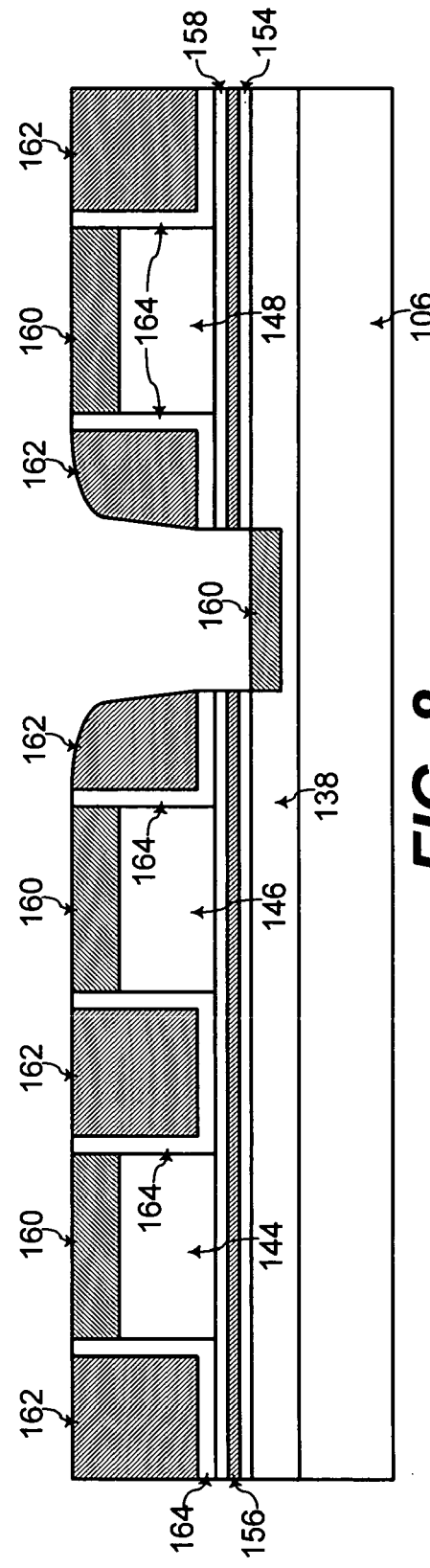

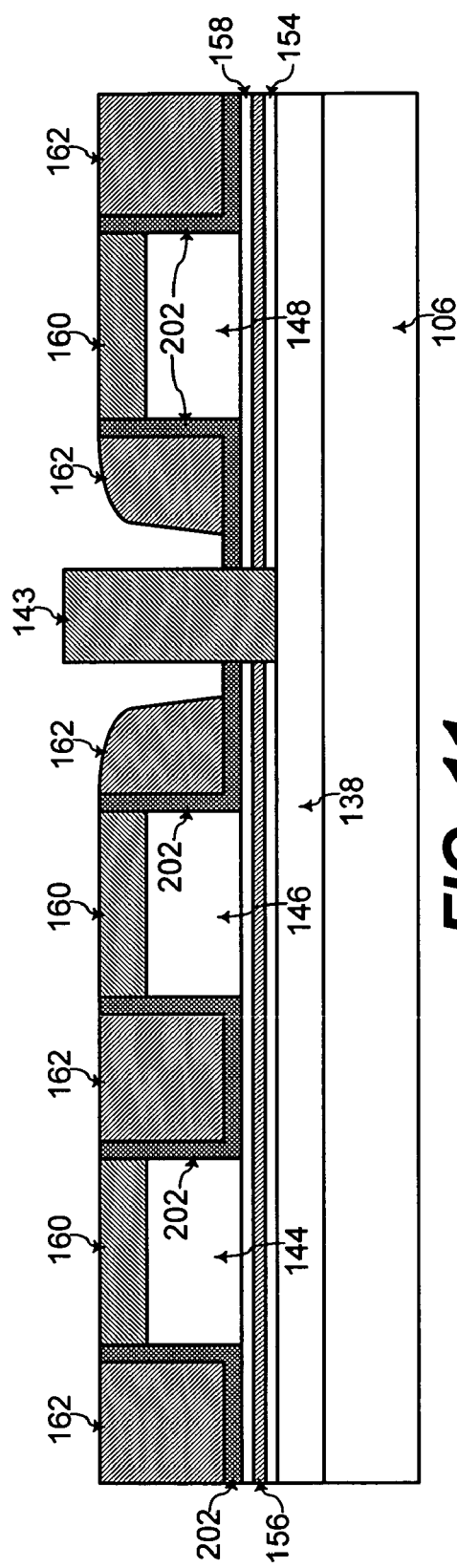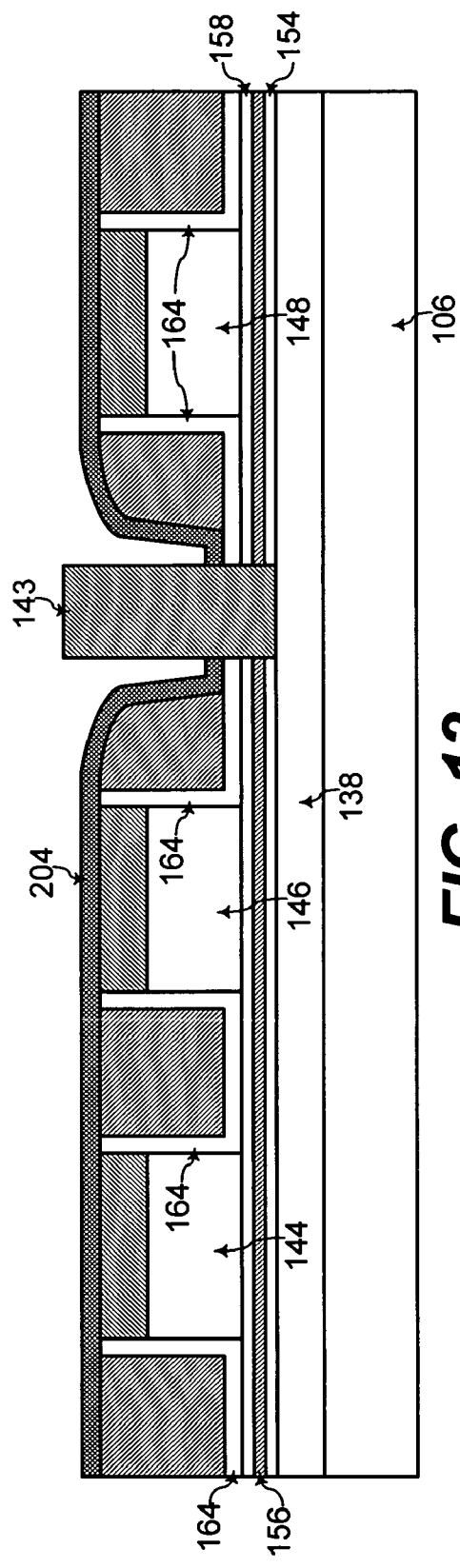

ALUMINUM OXIDE AS LINER OR COVER LAYER TO SPACERS IN MEMORY DEVICE

TECHNICAL FIELD

The present invention relates generally to memory devices such as flash memory devices for example, and more particularly to forming aluminum oxide as a liner or cover layer to spacers in a memory device for enhanced performance.

BACKGROUND OF THE INVENTION

FIG. 1 shows a SONOS (semiconductor oxide nitride oxide semiconductor) flash memory cell 100. The SONOS flash memory cell 100 includes a drain bit-line junction 102 and a source bit-line junction 104 formed within a semiconductor substrate 106. In addition, an ONO (oxide nitride oxide) stack comprised of a bottom oxide 108, a nitride 110, and a top oxide 112 is formed on the semiconductor substrate 106. Furthermore, a control gate 114 comprised of polysilicon is formed on the ONO stack.

A variable amount of charge carriers such as electrons is stored in the nitride 110 for storing bit information in the SONOS flash memory cell 100, as known to one of ordinary skill in the art. FIG. 2 shows a lay-out of an array 120 of such SONOS flash memory cells including an ONO stack 122 formed over a core active area 124. First, second, third, and fourth source/drain bit-line junctions 132, 134, 136, and 138, respectively, are formed within the core active area 124.

In addition, first, second, third, and fourth word-line gates 142, 144, 146, and 148, respectively, are formed across the source/drain bit-line junctions 132, 134, 136, and 138. Furthermore, bit-line junction contacts 143 are formed on the source/drain bit-line junctions 132, 134, 136, and 138, and word-line contacts 145 are formed on the word-line gates 142, 144, 146, and 148.

Each SONOS flash memory cell in the array 120 is formed by a portion 147 of a word-line gate over two adjacent source/drain bit-line junctions. Thus, a row of SONOS flash memory cells in the array 120 share a common word-line gate as the control gates of such SONOS flash memory cells. In addition, a column of SONOS flash memory cells share same source/drain bit-line junctions.

FIG. 3 shows a cross-sectional view across dashed line 152 of FIG. 2 along the source/drain bit-line junction 138 formed in the semiconductor substrate 106. Referring to FIG. 3, a bottom oxide layer 154, a nitride layer 156, and a top oxide layer 158 of the ONO stack 122 are formed on the source/drain bit-line junction 138. The word-line gates 144, 146, and 148 are formed across the source/drain bit-line junction 138. In addition, a metal silicide 160 is formed on the word-line gates 144, 146, and 148 for providing low resistance contact to the word-line gates 144, 146, and 148. The bit-line junction contact 143 is formed through the ONO stack 122 to contact the source/drain bit-line junction 138.

Additionally referring to FIG. 3, spacers 162 are formed to the sides of the word-line gates 144, 146, and 148. When the spacers 162 are comprised of silicon nitride ($Si_xN_y$), a liner layer 164 is formed between the spacers 162 and the word-line gates 144, 146, and 148, the metal silicides 160, and the top oxide layer 158. Such a liner layer 164 is comprised of silicon dioxide ($SiO_2$) in the prior art for a more stable interface between such structures 162, 160, 158, 144, 146, and 148.

Unfortunately, the oxide liner layer 164 does not significantly prevent hydrogen from reaching the nitride layer 156. Such hydrogen reaching the nitride layer 156 causes charge leakage from the nitride layer 156 which in turn degrades the performance of the SONOS flash memory cells.

In addition, the oxide liner layer 164 may not be used as an etch stop layer for preventing over-etch in a periphery region of the flash memory device. FIG. 4 shows a flash memory device 170 including a core region 172 and a periphery region 174. The core region 172 has the array 120 of SONOS flash memory cells fabricated therein, and the periphery region 174 has a logic circuit fabricated therein for controlling operation of the SONOS flash memory cells in the core region 172.

Referring to FIG. 5, a periphery active area 176 within the periphery region 174 is surrounded by a STI (shallow trench isolation) structure 178. A junction 175 for a device such as a MOSFET (metal oxide semiconductor field effect transistor) is fabricated for the logic circuit in the periphery region 174. An interlayer insulating material 180, typically comprised of silicon dioxide ($SiO_2$) doped with boron or phosphorous or both, is deposited on the semiconductor substrate 106.

An opening 182 is formed through the interlayer insulating material 180, and a contact plug 184 is formed to fill the opening 182 for making contact to the junction 175. A metal interconnect 186 is formed on the contact plug 184. Because the STI structure 178 and the interlayer insulating material 180 are both comprised of silicon dioxide ($SiO_2$), misalignment of the opening 182 with respect to the junction 175 and an over-etch of the interlayer insulating material 180 results in an etched portion 188 of the STI structure 178.

Undesired leakage current results when the contact plug 184 fills the etched portion 188 of the STI structure 178. Referring to FIGS. 3 and 5, when the liner layer 164 is also comprised of silicon dioxide ($SiO_2$), such a liner layer 164 cannot be used as an etch stop for preventing such a formation of the etched portion 188 of the STI structure 178.

Furthermore, when the liner layer 164 is comprised of silicon dioxide ($SiO_2$), the metal silicide 160 formed on the word-line gates may be disadvantageously formed on and between the source/drain bit-line junctions. FIG. 6 shows a cross-sectional view along line 190 of FIG. 2, and elements having the same reference numbers in FIGS. 3 and 6 refer to elements having similar structure and function.

However, FIG. 6 is the cross-sectional view during etching of the silicon nitride ($Si_xN_y$) for forming the spacers 162. If such nitride is over-etched, then exposed portions (between the word-line gates 146 and 148) of the top oxide liner layer 158 and the nitride layer 156 of the ONO stack are etched away as illustrated in FIG. 6.

Referring to FIG. 7, the exposed portion of the bottom oxide liner layer 154 is etched away during a subsequent cleaning process. Referring to FIG. 8, a metal silicide 160 such as cobalt silicide is formed with the polysilicon of the word-line gates 142, 144, 146, and 148. However, the metal silicide 160 is also formed with any exposed portions of the semiconductor substrate 106 including between the word-line gates 146 and 148.

Such a metal silicide 160 formed on the semiconductor substrate 106 disadvantageously leads to bit-line to bit-line leakage current. Bit-line to bit-line leakage current refers to undesired current between the source/drain bit-line junctions 132, 134, 136, and 138, such as the path shown with a dashed line 198 in FIG. 2.

SUMMARY OF THE INVENTION

Accordingly, aluminum oxide is formed as a liner or cover layer to the spacers for preventing such disadvantageous features of the oxide liner layer.

In a general aspect of the present invention for fabricating a memory device, spacers are formed to sides of word-line gates. In addition, aluminum oxide is formed as one of a liner layer or a cover layer to the spacers.

In an embodiment of the present invention, the aluminum oxide has a chemical composition of $Al_2O_3$.

The aluminum oxide as a liner layer is formed on the sides of the word-line gates before the spacers are formed. On the other hand, the aluminum oxide as a cover layer is formed on the spacers after the spacers are formed.

In a further embodiment of the present invention, source/drain bit-line junctions are formed in a semiconductor substrate across the word-line gates. In that case, the aluminum oxide is formed also over the semiconductor substrate between the word-line gates. A metal silicide is formed on the word-line gates with the aluminum oxide preventing formation of the metal silicide on the semiconductor substrate between the word-line gates.

In another embodiment of the present invention, when the aluminum oxide is formed as a cover layer, an oxide liner layer is additionally formed on the sides of the word-line gates before the spacers are formed.

In a further embodiment of the present invention, the memory device is a SONOS (semiconductor oxide nitride oxide semiconductor) flash memory device. In that case, source/drain bit-line junctions are formed in a semiconductor substrate across the word-line gates. In addition, an ONO (oxide nitride oxide) stack is subsequently formed on the semiconductor substrate before formation of the word-line gates on the ONO stack.

In another embodiment of the present invention, charge storage regions are formed under the word-line gates, and the aluminum oxide blocks hydrogen from reaching the charge storage regions. In a further embodiment of the present invention, the aluminum oxide has negative charge carriers for reducing bit-line to bit-line leakage current.

In another embodiment of the present invention, the aluminum oxide is formed also over an active area in a periphery region of the memory device. An interlayer insulating layer formed over the aluminum oxide is patterned in a first etch process using the aluminum oxide as an etch stop layer. In addition, the aluminum oxide is patterned in a second etch process to form an opening through the interlayer insulating layer and the aluminum oxide over the active area.

The interlayer insulating layer and an isolation structure surrounding the active area have a same etch selectivity that is different from an etch selectivity of the aluminum oxide. For example, the interlayer insulating layer and the isolation structure are comprised of silicon dioxide ($SiO_2$). Thus, the isolation structure is not etched during etching of the aluminum oxide for preventing leakage current through the active area.

These and other features and advantages of the present invention will be better understood by considering the following detailed description of the invention which is presented with the attached drawings.

BRIEF DESCRIPTION OF THE DRAWINGS

FIGS. 6, 7, and 8 show cross-sectional views across line 190 of FIG. 2 with undesired formation of metal silicide on the semiconductor substrate;

FIG. 11 shows the cross-sectional view of FIG. 9 with further formation of a bit-line contact, according to an embodiment of the present invention;

FIG. 12 shows the cross-sectional view of FIG. 10 with further formation of a bit-line contact, according to an embodiment of the present invention;

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, and 16 refer to elements having similar structure and function.

DETAILED DESCRIPTION

Figure 1:
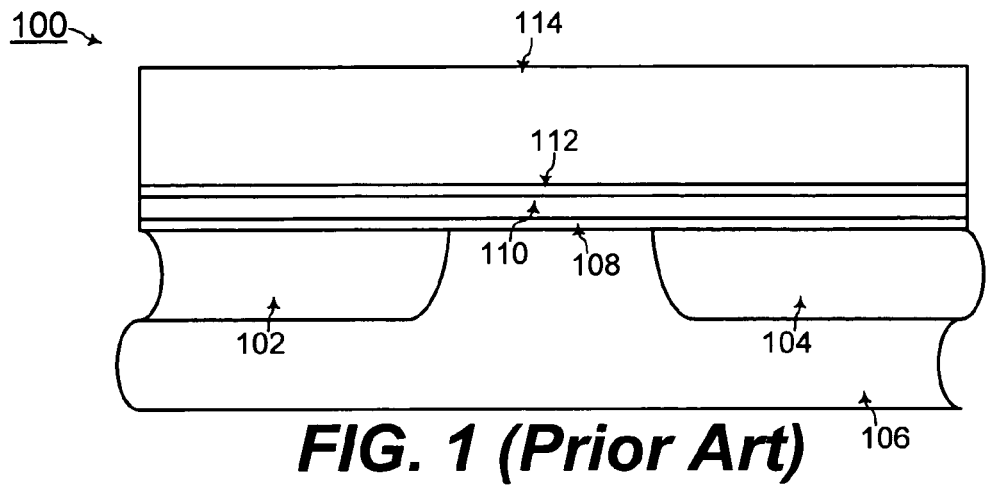
FIG. 1 shows a SONOS flash memory cell, according to the prior art.
Figure 2:
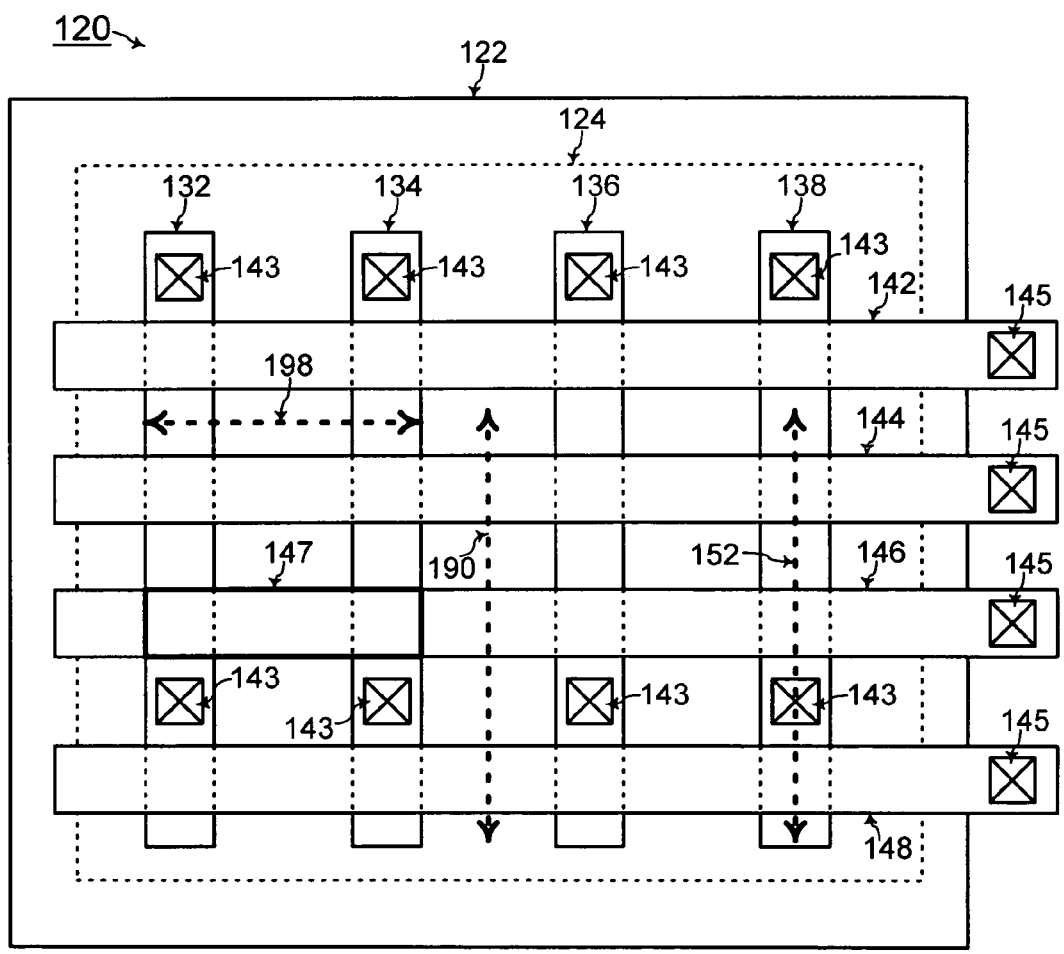
FIG. 2 shows a top view of a lay-out of an array of SONOS flash memory cells.
Figure 9:
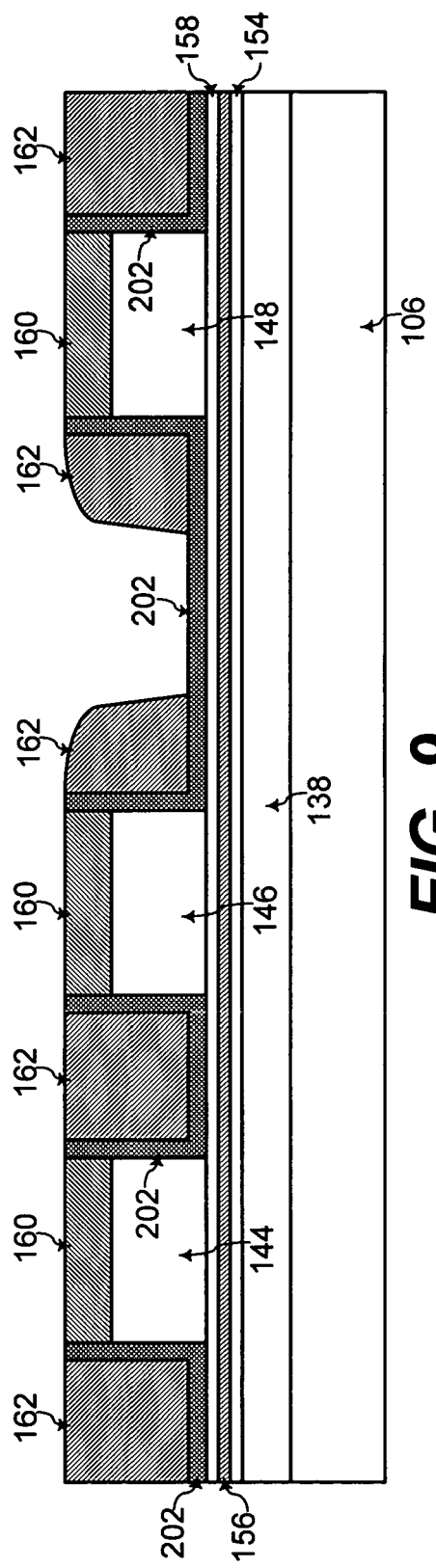
FIG. 9 shows a cross-sectional view along line 152 of FIG. 2 with formation of aluminum oxide as a liner layer, according to an embodiment of the present invention.
Figure 10:
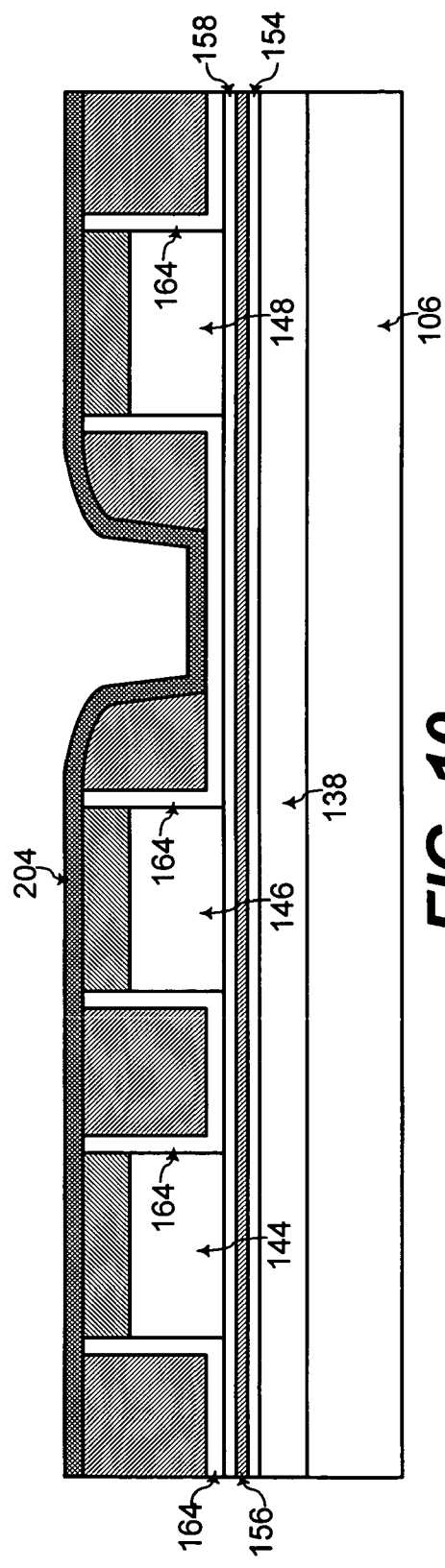
FIG. 10 shows a cross-sectional view along line 152 of FIG. 2 with formation of aluminum oxide as a cover layer, according to another embodiment of the present invention.

FIGS. 9 and 10 show the cross-sectional view along line 152 of FIG. 2 before formation of the bit-line junction contacts 143. FIGS. 11 and 12 show the cross-sectional views of FIGS. 9 and 10, respectively, after formation of the bit-line junction contacts 143. Elements having the same reference number in FIGS. 3, 9, 10, 11, and 12 refer to elements having similar structure and function.

However, in FIGS. 9 and 11, a liner layer 202 is comprised of aluminum oxide ($Al_XO_Y$). In an example embodiment of the present invention, the aluminum oxide for the liner layer 202 has a chemical composition of $Al_2O_3$. In the embodiment of FIGS. 9 and 11, when the aluminum oxide is formed as the liner layer 202, the oxide liner layer 164 of FIG. 3 is not formed.

Figure 3:
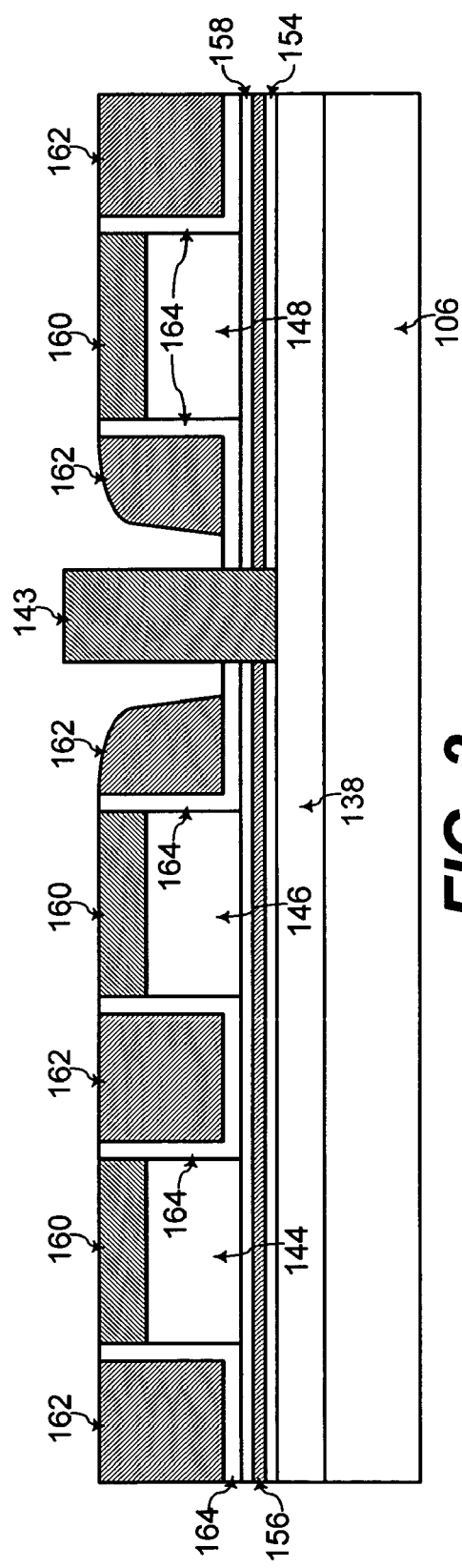
FIG. 3 shows a cross-sectional view along line 152 of FIG. 2 including a liner layer comprised of silicon dioxide.

In that case, the liner layer 202 comprised of aluminum oxide ($Al_2O_3$) in FIGS. 9 and 11 replaces the oxide liner layer 164 of FIG. 3. Thus, the liner layer 202 of aluminum oxide ($Al_2O_3$) is formed before formation of the spacers 162. In such an embodiment, the liner layer 202 of aluminum oxide ($Al_2O_3$) is deposited, and subsequently, the nitride ($Si_XN_Y$) for the spacers 162 is deposited and directionally etched to form the spacers 162.

In another embodiment of the present invention in FIGS. 10 and 12, a cover layer 204 is blanket-deposited and is comprised of aluminum oxide ($Al_XO_Y$). In an example embodiment of the present invention, the aluminum oxide of the cover layer 204 has a chemical composition of Al$_2$O$_3$. In the embodiment of FIGS. 10 and 12, when the aluminum oxide is formed as the cover layer 204, the oxide liner layer 164 of FIG. 3 is also formed in FIGS. 10 and 12.

In that case, the cover layer 204 of aluminum oxide (Al$_2$O$_3$) is deposited after formation of the spacers 162 and the metal silicide 160. Thus, the cross-sectional view of FIG. 10 occurs after the cross-sectional view of FIG. 3 but before formation of the bit-line junction contacts 143 in FIG. 12.

Figure 4:
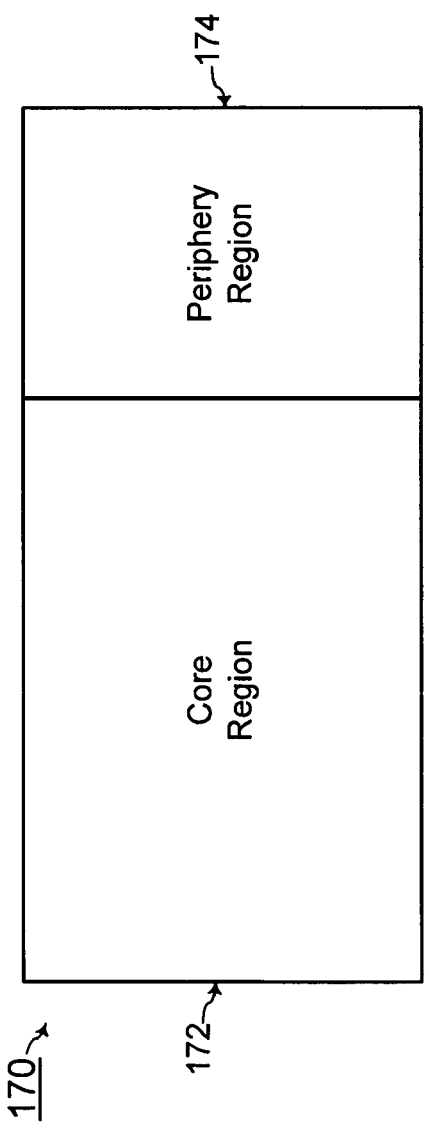
FIG. 4 shows a block diagram of a flash memory device including a core region and a periphery region.
Figure 5:
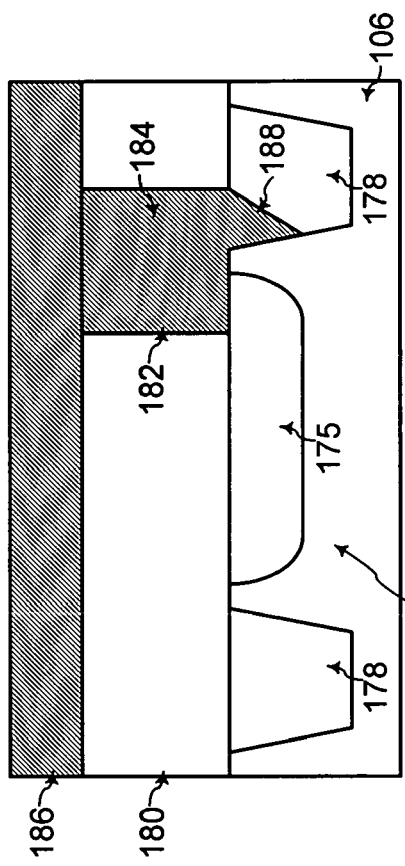
FIG. 5 shows a cross-sectional view of an etched portion of a shallow isolation structure (STI) structure within an active region of the periphery region of FIG. 4.
Figure 13:
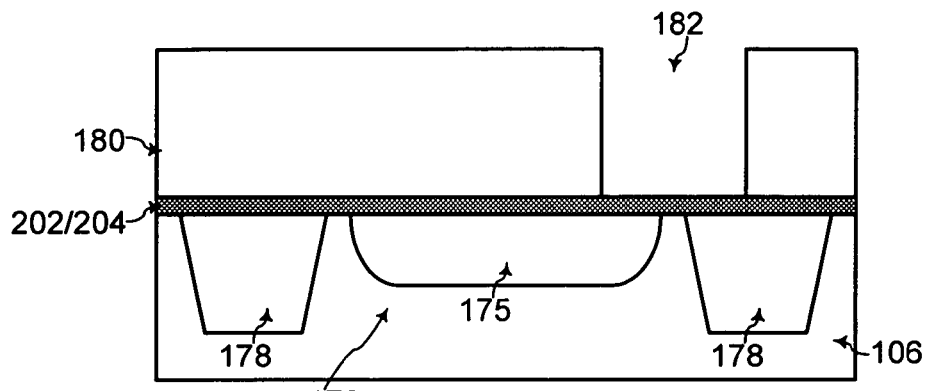
FIGS. 13, 14, and 15 shows cross-sectional views during patterning an opening for a contact plug using the aluminum oxide as an etch stop layer, according to an embodiment of the present invention.

Such a liner or cover layer 202/204 may advantageously be used as an etch stop layer within the periphery region 174 of FIG. 4. Referring to FIGS. 5 and 13, elements having the same reference number in FIGS. 5 and 13 refer to elements having similar structure and function. The liner or cover layer 202/204 deposited for the SONOS flash memory cells in the core region 172 is also simultaneously deposited on the semiconductor substrate 176 of the periphery region 174.

Thereafter, the interlayer insulating material 180 comprised of silicon dioxide (SiO$_2$) is deposited on the liner or cover layer 202/204. Referring to FIG. 13, the interlayer insulating material 180 is patterned with a first etch process for forming the opening 182 through the interlayer insulating material 180. A first etching agent of the first etch process etches the interlayer insulating material 180 at a substantially faster rate than the aluminum oxide (Al$_2$O$_3$) of the liner or cover layer 202/204.

With such different etch selectivity between the interlayer insulating material 180 and the liner or cover layer 202/204, the liner or cover layer 202/204 substantially remains at the bottom of the opening 182 in FIG. 13 to protect the STI structure 178. The STI structure 178 is also comprised of silicon dioxide (SiO$_2$), and a portion of such a STI structure 178 is prone to be etched away without the liner or cover layer 202/204, as illustrated in FIG. 5.

Figure 14:
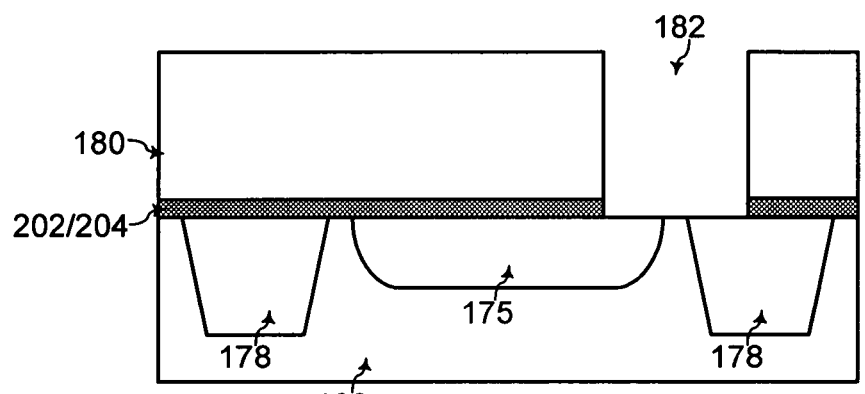

Referring to FIG. 14, a second etch process is performed for etching away the portion of the liner or cover layer 202/204 exposed through the opening 182. A second etching agent of the second etch process etches the aluminum oxide (Al$_2$O$_3$) of the liner or cover layer 202/204 at a substantially faster rate than the silicon dioxide (SiO$_2$) of the interlayer insulating material 180 and the STI structure 178.

With such different etch selectivity between the silicon dioxide (SiO$_2$) and the aluminum oxide (Al$_2$O$_3$), the STI structure 178 comprised of silicon dioxide (SiO$_2$) is not etched during the second etch process for patterning the liner or cover layer 202/204. Thereafter referring to FIG. 15, the contact plug 184 is formed to fill the opening 182.

Figure 15:
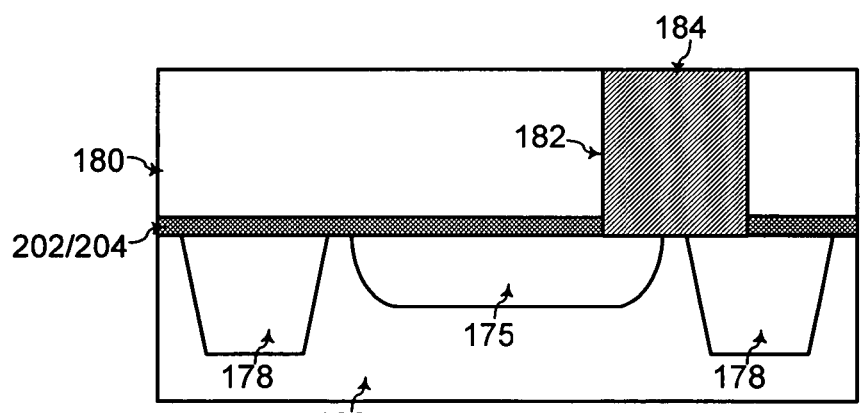

With preservation of the STI structure 178, the contact plug 184 does not cut into the STI structure 178 in FIG. 15. Thus, even with mis-alignment of the contact plug 184 onto the STI structure 178, leakage current is prevented for devices formed in the active area 176 of the periphery region 174. In this manner, use of the liner or cover layer 202/204 as the etch stop layer in FIGS. 13, 14, and 15 is advantageous for preventing such leakage current in the periphery region 174.

Figure 6:
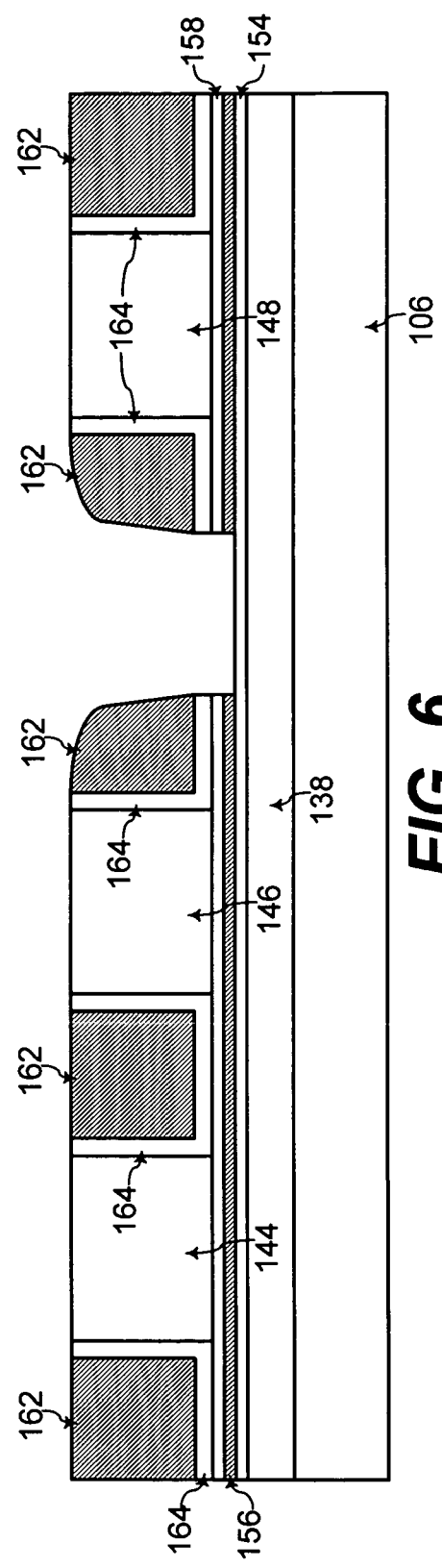
Figure 16:
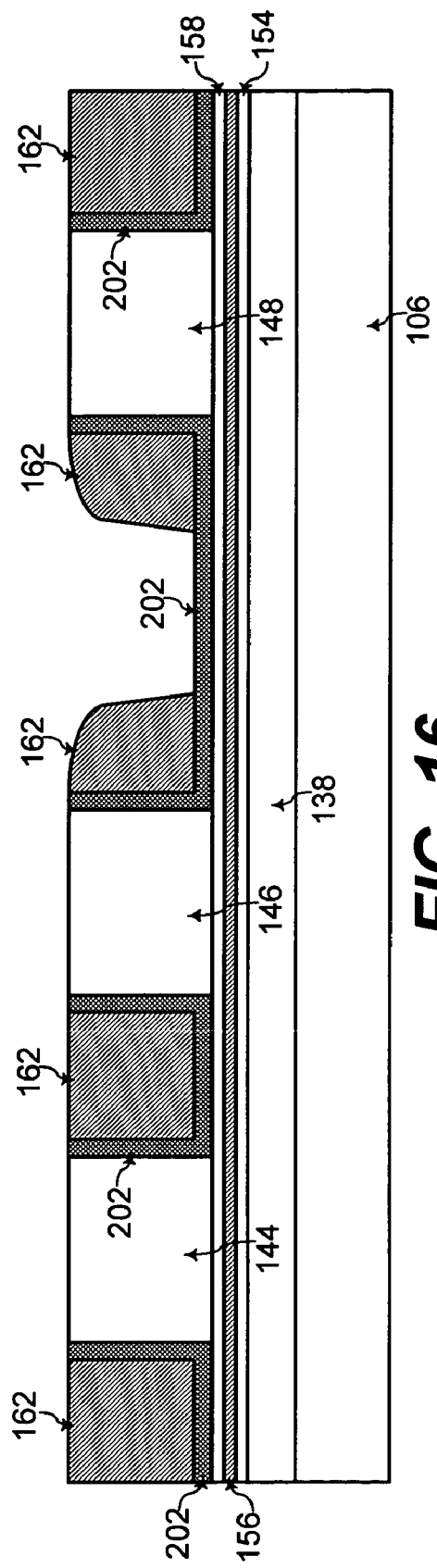
FIG. 16 shows the cross-sectional view of FIG. 9 but during formation of spacers such that the aluminum oxide prevents formation of metal silicide on the semiconductor substrate, according to an embodiment of the present invention.

In addition, the liner layer 202 of FIG. 9 advantageously prevents formation of the metal silicide 160 on the semiconductor substrate 106 between the word-line gates 146 and 148 (in contrast to FIGS. 6, 7, and 8). FIG. 16 shows the cross-sectional view of FIG. 9, before formation of the metal silicide 160 on the word-line gates 144, 146, and 148. Comparing FIGS. 6 and 16, the liner layer 202 comprised of aluminum oxide (Al$_2$O$_3$) is formed on the top oxide layer 158 over the semiconductor substrate 106 between the word-line gates 146 and 148 in FIG. 16.

The etch process for etching the nitride for forming the spacers 162 in FIG. 16 uses an etching agent that etches nitride at a substantially faster rate than the aluminum oxide (Al$_2$O$_3$) of the liner layer 202. With such different etch selectivity, the liner layer 202 of aluminum oxide (Al$_2$O$_3$) substantially remains over the semiconductor substrate 106 between the word-line gates 146 and 148 in FIG. 16. Thus, the semiconductor substrate 106 does not become exposed before formation of the metal silicide 160 on the word-line gates 144, 146, and 148.

Subsequently after FIG. 16, the metal silicide 160 is formed only on the exposed word-line gates 144, 146, and 148 as illustrated in FIG. 9. By preventing formation of the metal silicide 160 on the semiconductor substrate 106 for the array of SONOS flash memory cells, the bit-line to bit-line leakage current is minimized with the liner layer 202.

Furthermore, referring to FIGS. 11 and 12, the liner or cover layer 202/204 comprised of aluminum oxide (Al$_2$O$_3$) has more negative charge therein than silicon dioxide (SiO$_2$). Thus, the liner or cover layer 202/204 disposed on the semiconductor substrate 106 between the word-line gates acts to decrease the conductivity of the semiconductor substrate between the bit-line junctions and thus to decrease the leakage current between the bit-line junctions.

Additionally, hydrogen diffuses through the aluminum oxide (Al$_2$O$_3$) at a slower rate than silicon dioxide (SiO$_2$). The liner or cover layer 202/204 comprised of aluminum oxide (Al$_2$O$_3$) acts as a hydrogen block for minimizing the amount of hydrogen reaching the nitride layer 156 of the ONO stack. Portions of the nitride layer 156 disposed under the word-line gates 142, 144, 146, or 148 form charge storage regions for storing charge carriers for the SONOS flash memory cells. Hydrogen reaching the nitride layer 156 accelerates escape of such charge carriers from the charge storage regions. The liner or cover layer 202/204 blocks hydrogen from reaching the nitride layer 156 for enhancing data retention of the SONOS flash memory cells.

The foregoing is by way of example only and is not intended to be limiting. For example, the present invention is described for a SONOS flash memory device having an array of flash memory cells. However, the present invention may be used for other types of memory devices. In addition, any number of elements illustrated and described herein is by way of example only, and the present invention may be used for any number of such elements. For example, the array 120 of flash memory cells in FIG. 2 would typically have a higher number of word-line gates and bit-line junctions. Furthermore, any materials mentioned herein are by way of example only.

The present invention is limited only as defined in the following claims and equivalents thereof.

We claim:

1. A method for fabricating a memory device, comprising:
   forming spacers to sides of word-line gates;
   forming aluminum oxide as one of a liner layer or a cover layer to said spacers; and
   forming charge storage regions under the word-line gates, wherein the aluminum oxide blocks hydrogen from reaching the charge storage regions,
   and wherein the liner layer is disposed between the spacers and the charge storage regions,
   and wherein the cover layer remains over a conductive material formed on the word-line gates.

2. The method of claim 1, wherein the aluminum oxide has a chemical composition of Al$_2$O$_3$.

3. The method of claim 1, wherein the aluminum oxide as a liner layer is formed on the sides of the word-line gates before the spacers are formed.

4. The method of claim 3, further comprising:
forming source/drain bit-line junctions in a semiconductor substrate across the word-line gates;
forming the aluminum oxide also over the semiconductor substrate between the word-line gates; and
forming a metal silicide on the word-line gates with the aluminum oxide preventing formation of the metal silicide on the semiconductor substrate between the word-line gates.

5. The method of claim 1, wherein the aluminum oxide as a cover layer is formed on the spacers after the spacers are formed.

6. The method of claim 5, further comprising:
forming an oxide liner layer on the sides of the word-line gates before the spacers are formed.

7. The method of claim 1, wherein the memory device is a SONOS (semiconductor oxide nitride oxide semiconductor) flash memory device.

8. The method of claim 7, further comprising:
forming source/drain bit-line junctions in a semiconductor substrate across the word-line gates; and
forming an ONO (oxide nitride oxide) stack on the semiconductor substrate before formation of the word-line gates on the ONO stack.

9. The method of claim 1, further comprising:
forming source/drain bit-line junctions in a semiconductor substrate across the word-line gates; and
forming the aluminum oxide also over the semiconductor substrate between the word-line gates;
wherein the aluminum oxide has negative charge carriers for reducing bit-line to bit-line leakage current.

10. The method of claim 1, further comprising:
forming the aluminum oxide also over an active area in a periphery region of the memory device;
patterning an interlayer insulating layer over the aluminum oxide in a first etch process using the aluminum oxide as an etch stop layer; and
patterning the aluminum oxide in a second etch process to form an opening through the interlayer insulating layer and the aluminum oxide over the active area;
wherein the interlayer insulating layer and an isolation structure surrounding the active area have a same etch selectivity that is different from an etch selectivity of the aluminum oxide.

11. The method of claim 10, wherein interlayer insulating layer and the isolation structure are comprised of silicon dioxide ($SiO_2$).

12. A memory device, comprising:
spacers formed to sides of word-line gates;
aluminum oxide formed as one of a liner layer or a cover layer to said spacers; and
charge storage regions formed under the word-line gates, wherein the aluminum oxide is disposed to block hydrogen from reaching the charge storage regions, and wherein the liner layer is disposed between the spacers and the charge storage regions,
and wherein the cover layer remains over a conductive material formed on the word-line gates.

13. The memory device of claim 12, wherein the aluminum oxide has a chemical composition of $Al_2O_3$.

14. The memory device of claim 12, wherein the aluminum oxide as a liner layer is formed on the sides of the word-line gates under the spacers.

15. The memory device of claim 14, further comprising:
source/drain bit-line junctions formed in a semiconductor substrate across the word-line gates;
wherein the aluminum oxide is also disposed over the semiconductor substrate between the word-line gates; and
a metal silicide formed on the word-line gates without formation of the metal silicide on the semiconductor substrate between the word-line gates.

16. The memory device of claim 12, wherein the aluminum oxide as a cover layer is formed over the spacers.

17. The memory device of claim 16, further comprising:
an oxide liner layer formed between the sides of the word-line gates and the spacers.

18. The memory device of claim 12, wherein the memory device is a SONOS (semiconductor oxide nitride oxide semiconductor) flash memory device further comprising:
source/drain bit-line junctions formed in a semiconductor substrate across the word-line gates; and
an ONO (oxide nitride oxide) stack formed on the semiconductor substrate with the word-line gates formed on the ONO stack.

19. A memory device, comprising:
spacers formed to sides of word-line gates;
aluminum oxide formed as one of a liner layer or a cover layer to said spacers;
charge storage regions formed under the word-line gates, wherein the aluminum oxide is disposed to block hydrogen from reaching the charge storage regions; and
source/drain bit-line junctions formed in a semiconductor substrate across the word-line gates, wherein the aluminum oxide is formed also over the semiconductor substrate between the word-line gates, and wherein the aluminum oxide has negative charge carriers for reducing bit-line to bit-line leakage current.

20. The memory device of claim 12, further comprising:
an active area in a periphery region of the memory device, wherein the aluminum oxide is also formed over the active area;
an interlayer insulating layer formed over the aluminum oxide; and
an opening formed through the interlayer insulating layer and the aluminum oxide over the active area;
wherein the interlayer insulating layer and an isolation structure surrounding the active area have a same etch selectivity that is different from an etch selectivity of the aluminum oxide.

* * * * *